(12) United States Patent
Bleus et al.

(10) Patent No.: US 10,312,801 B2
(45) Date of Patent: Jun. 4, 2019

(54) HIGH POWER DENSITY INVERTER (II)

(71) Applicant: CE+T Power Luxembourg S.A., Troisvierges (LU)

(72) Inventors: Paul Bleus, Liege (BE); Thierry Joannes, Flemalle (BE); François Milstein, Liege (BE); Pierre Stassain, Malmedy (BE); Fabrice Frebel, Wandre (BE)

(73) Assignee: CE+T Power Luxembourg S.A., Troisvierges (LU)

(*) Notice: Subject to any disclaimer, the term of this patent is extended or adjusted under 35 U.S.C. 154(b) by 0 days.

(21) Appl. No.: 15/743,054

(22) PCT Filed: Jun. 23, 2016

(86) PCT No.: PCT/EP2016/064615
§ 371 (c)(1),
(2) Date: Jan. 9, 2018

(87) PCT Pub. No.: WO2017/005505
PCT Pub. Date: Jan. 12, 2017

(65) Prior Publication Data
US 2018/0205314 A1    Jul. 19, 2018

(30) Foreign Application Priority Data

Jul. 9, 2015 (EP) .................................. 15176078
Nov. 20, 2015 (EP) .................................. 15195518

(51) Int. Cl.
*H02M 1/12* (2006.01)
*H02M 7/521* (2006.01)
(Continued)

(52) U.S. Cl.
CPC ............. *H02M 1/44* (2013.01); *H02M 1/126* (2013.01); *H02M 1/143* (2013.01); *H02M 1/15* (2013.01);
(Continued)

(58) Field of Classification Search
CPC ........ H02M 7/003; H02M 1/14; H02M 1/126; H02M 1/1083; H02M 1/1143;
(Continued)

(56) References Cited

U.S. PATENT DOCUMENTS

2006/0120001 A1*  6/2006  Weber .................... H02M 7/003
                                                            361/103
2007/0189046 A1*  8/2007  Sugino .................... H02M 1/44
                                                            363/44
(Continued)

FOREIGN PATENT DOCUMENTS

EP    2149973 A2    2/2010
EP    2675054 A1   12/2013
EP    2879475 A1    6/2015

*Primary Examiner* — Alex Torres-Rivera
(74) *Attorney, Agent, or Firm* — Reinhart Boerner Van Deuren P.C.

(57) ABSTRACT

The present invention relates to a single phase, non-insulated, miniaturized DC/AC power inverter having an output power density higher than 3000 W/dm$^3$, wherein said power inverter is packaged in a casing made of an external electrically conductive enclosure containing a fan blowing in an axial direction to a side face of the casing and, in a stacked elevation arrangement, successively from a bottom side to a top side, a layer of active filter capacitors, a heatsink, a layer of wideband semiconductors switches connected to a PCB with thermal vias and a layer of active filtering inductors, the fan and the component stacked arrangement being designed so as, in operation, the external temperature of the casing (Continued)

does not overcome 60° C. in any point, for an ambient temperature of maximum 30° C. under a maximum load of 2 kVA.

9 Claims, 6 Drawing Sheets

(51) Int. Cl.
| | |
|---|---|
| *H02M 1/44* | (2007.01) |
| *H05K 7/20* | (2006.01) |
| *H02M 1/14* | (2006.01) |
| *H02M 1/15* | (2006.01) |
| *H02M 7/5387* | (2007.01) |
| *H03K 17/13* | (2006.01) |
| *H05K 3/00* | (2006.01) |
| *H02M 1/00* | (2006.01) |
| *H02M 7/48* | (2007.01) |

(52) U.S. Cl.
CPC ........ *H02M 7/5387* (2013.01); *H03K 17/133* (2013.01); *H05K 3/0061* (2013.01); *H05K 7/209* (2013.01); *H05K 7/20909* (2013.01); *H02M 2001/0058* (2013.01); *H02M 2001/123* (2013.01); *H02M 2007/4811* (2013.01)

(58) Field of Classification Search
CPC ...... H02M 3/285; H02M 3/11; H02M 3/3155; H02M 3/325; H02M 3/335; H02M 7/5387; H02M 7/53871; H02M 7/48
USPC .... 363/40, 47, 48, 65, 71, 97, 98, 120, 123, 363/131, 132, 146, 147
See application file for complete search history.

(56) References Cited

U.S. PATENT DOCUMENTS

| | | | |
|---|---|---|---|
| 2008/0174966 A1* | 7/2008 | Badger | H02M 7/003 361/709 |
| 2012/0257429 A1* | 10/2012 | Dong | H02M 3/1582 363/127 |
| 2013/0044434 A1* | 2/2013 | Sharaf | H05K 7/20927 361/702 |
| 2013/0235628 A1* | 9/2013 | Dong | H02M 7/797 363/47 |
| 2014/0369006 A1 | 12/2014 | Williams | |
| 2016/0359426 A1* | 12/2016 | Jitaru | H05K 1/0256 |
| 2017/0181257 A1* | 6/2017 | Rostamzadeh | H05B 41/24 |

* cited by examiner

HIGH POWER DENSITY INVERTER (II)

FIELD OF THE INVENTION

The present invention relates to a single phase, non-insulated, miniaturized DC/AC power inverter having a very high, preferably extremely high output power density.

TECHNOLOGICAL BACKGROUND AND PRIOR ART

Power inverters (or in short inverters) are electronic devices which transform direct current (DC) to alternating current (AC). In particular, inverters play nowadays an economic and environmental role which is more and more important in the frame of transformation of DC current produced by solar panels, batteries or similar sources into AC current for domestic or industrial use as well as in electric cars.

Inverters manufactured by the Applicant for commercial and industrial companies permit saving of their critical applications by using energy stored in batteries, during distribution grid breakdown. Inverter Media™ manufactured by the Applicant already allows to reach a power density of 680 W/liter at 2 kVA.

Inverters used for example in electricity production facilities from solar energy still have a noticeable size (typically 50 liters or the size of a portable cooler). Size reduction of >10× in volume, i.e. typically shrinking down to something smaller than a small laptop would enable powering more homes with solar energy, as well as improving distribution efficiency and distances ranges reached with electrical grids. Future will thus be dedicated to more robust, more reliable and more intelligent power inverters.

In order to achieve very high power density and consequently smaller conversion systems, designers of inverter topologies had primarily to target increased efficiency and common mode (CM) noise reduction. Higher efficiency has been achieved thanks to improvements in semiconductor materials and processing, as well as in magnetic materials. Use of wideband-gap semiconductors (silicon carbide—SiC or gallium nitride—GaN) allows to improve efficiency in high frequency power converters, while the latter allow increasing switching frequency and thus reducing passive components size.

It is known that EMI noise is both in the form of conducted EMI, i.e. noise travelling along wires or conducting paths and through electronic components and in the form of radiated EMI (RFI), i.e. noise travelling through the air in the form of electro-magnetic fields or radio waves. In high-speed switching converters (frequency typically from 50 kHz to 1 MHz), most of the conducted EMI comes from the switching transistors and from the rectifiers. For preventing such EMI noise, one generally uses EMI filters made of passive components such as capacitors and inductors forming LC circuits. Conducted EMI is divided into common-mode noise (CMN) and differential-mode noise (DMN). CMN flows in the same direction in line and neutral AC power conductors, is in phase with itself relative to ground and returns to ground. Suitable CMN filter comprises inductors L100, L200 placed in series with each power line and respective Y-capacitors C100, C200 connecting each power conductors to ground (see for example CMN filter 100 in FIG. 1 in the case of a DC/AC converter). DMN exists between AC line and neutral conductors and is 180° out of phase with itself. Suitable DMN filter comprises C340 X-capacitors bridging the power lines, possibly supplemented by differential-suppression inductors L300, L400 (see for example DMN filter 101 in FIG. 1 in the case of a DC/AC converter).

AIMS OF THE INVENTION

The present invention aims at providing a power inverter having extremely high output power density.

In particular the invention is targeting to deliver an inverter having an output power density greater than 50 W/in$^3$ (or 3051 W/dm$^3$ or W/liter) on a maximum load of 2 kVA.

Another goal of the present invention is to allow use of wideband-gap semiconductor switches, while assuring soft switching thereof for reducing switch losses, and while keeping inside acceptable limits for EMI noise generated by the very high switching speed of these components and while suitably managing high dV/dt in the switch commands.

SUMMARY OF THE INVENTION

The present invention relates to a single phase, non-insulated, miniaturized DC/AC power inverter having an output power density higher than 3000 W/dm$^3$ and comprising:
- a DC input;
- an AC output;
- at least a H full-bridge topology switching circuit having an input connected to the DC input and an output connected to the AC output, and comprising switches made of wide-band semiconductors and preferably of gallium nitride or GaN semiconductors;
- at least one common mode noise EMI filter connected between the DC input and the input of the H full-bridge switching circuit, between the output of the H full-bridge switching circuit and the AC output respectively, said common mode noise filters being referenced to an earth shielding or directly to earth, said common noise filters comprising filtering inductors and so-called Y capacitors;
- at least one differential mode noise EMI filter connected, in series with a corresponding common mode noise filter, between the DC input and the input of the H full-bridge switching circuit, between the output of the H full-bridge switching circuit and the AC output respectively, said differential mode noise filters comprising so-called X filtering capacitors and optionally inductors;
- a ripple-compensating active filter comprising a switching half-bridge topology provided in parallel with the H full-bridge switching circuit and connected to a LC filter, made of at least one inductor (L6) and a plurality of storage capacitors (C5);

wherein said power inverter is packaged in a casing made of an external electrically conductive enclosure containing a fan blowing in an axial direction to a side face of the casing and, in a stacked elevation arrangement, successively from a bottom side to a top side, a layer of active filter capacitors, a heatsink, a layer of wideband semiconductors switches connected to a PCB with thermal vias and a layer of active filtering inductors, the fan and the component stacked arrangement being designed so as, in operation, the external temperature of the casing does not overcome 60° C. in any point, for an ambient temperature of maximum 30° C. under a maximum load of 2 kVA.

According to preferred embodiments, the DC/AC power inverter of the invention also comprises at least one of the following characteristics, or a suitable combination thereof:

the layer of active filter capacitors is composed of PCB-mounted rows of regularly spaced multilayer ceramic capacitors (MLCC), said capacitors being separated by a gap, said gap being preferably of about 1 mm and oriented in the blowing direction of the fan;

the heatsink is a one-piece machined metallic heatsink selected from the group consisting of a multiple blades, honeycomb, interlaced-fins and metal foam heatsink, said heatsink being adjacent to the layer of active filter capacitors;

the casing external conductive enclosure surrounds a conductive shielding separated thereof by a thermally conductive interface made of a gap pad;

the active filtering inductors are composed of ferrite cores on which Litz wire is directly wound without a coil former, each inductor being made of two coils separated by a ceramic foil placed between the ferrites in order to create an air gap as well as thermal drain;

the layer of wideband semiconductors switches connected to a PCB with thermal vias is adjacent the heatsink thanks to a ceramic insulation and microspring contacts, silicone foam being provided in gaps in order to uniformly spread switch contact pressure on the heatsink;

the casing enclosure, the conductive shielding and the heatsink are made of copper;

the passive filters, i.e. the common mode and differential mode EMI filters, are separated from the rest in the casing;

part of the active filtering inductors are thermally fastened to the conductive shield.

SHORT DESCRIPTION OF THE DRAWINGS

FIG. 1, already mentioned above, shows an example of designing a basic solution for EMI filtering (common mode and differential filtering) in a DC/AC power converter.

FIG. 2 schematically represents an example of embodiment for an inverter according to the present invention, the inverter having a five legs (or half-bridges) topology.

FIG. 3 schematically represents a preferred embodiment for GaN driver protection against common mode EMI high dV/dt according to the present invention.

DETAILED DESCRIPTION OF THE INVENTION

According to one embodiment, the inverter according to the present invention has to be designed to meet the requirements of Table 1.

Accordingly, GaN transistors operated in so-called soft switching mode or ZVS (Zero Voltage Switching) mode, combined with a specific parallel active filtering topology and with the use of multilayer ceramic capacitors (MLCC) as storage components are the key factors that have contributed to reaching such a high power density. The shape of the heatsink, the geometric arrangement of the ceramic capacitors and a thermal interfaces optimization contribute still to a low temperature of the device while in full load operation. An optimized software running on a fast microcontroller associated with a dedicated logic circuit (CPLD for complex programmable logic device) warrants ZVS behavior through the entire operation range and reduces electromagnetic noise. Double shielding and an optimized set of filters allow the inverter to meet electromagnetic compliance requirements.

DETAILED DESCRIPTION OF PREFERRED EMBODIMENTS OF THE INVENTION

The design methodology applied comprises: precise dimensioning with analytical calculations and finite elements modeling; use of SPICE simulations for power and control; 3D mechanical modeling; and use of thermal simulations. This allowed to create an inverter device meeting all the requirements of Table 1 in a single calculation run.

According to a preferred embodiment of the invention, the use of GaN technology enables a power density of ~143 W/in.$^3$ for the 2 kVA inverter designed in this project. The dimensions thereof are approximately 2.5×1.6×3.5 inches, corresponding to a volume of about 14 inches$^3$ (or 0.2 liter).

GaN transistors have many very useful electrical characteristics (low $R_{ds\_on}$, low $Q_{gate}$ and $C_{ds}$, ultra-low $Q_{rr}$). These clearly create technological advantages over currently and routinely used MOSFET and IGBT devices (both having small size and low production costs). Unfortunately, they also have serious drawbacks due to their very fast switching characteristics (for example extremely high "dV/dt"): they are noticeably challenging to drive and also require sensitive electromagnetic noise management. Another pitfall is the high voltage drop due to the reverse current when the GaN is turned off. One solution selected according to the present invention to overcome these difficulties consists in controlling all GaN transistors using soft switching (or ZVS switching) through the entire operation range.

Figure 1:
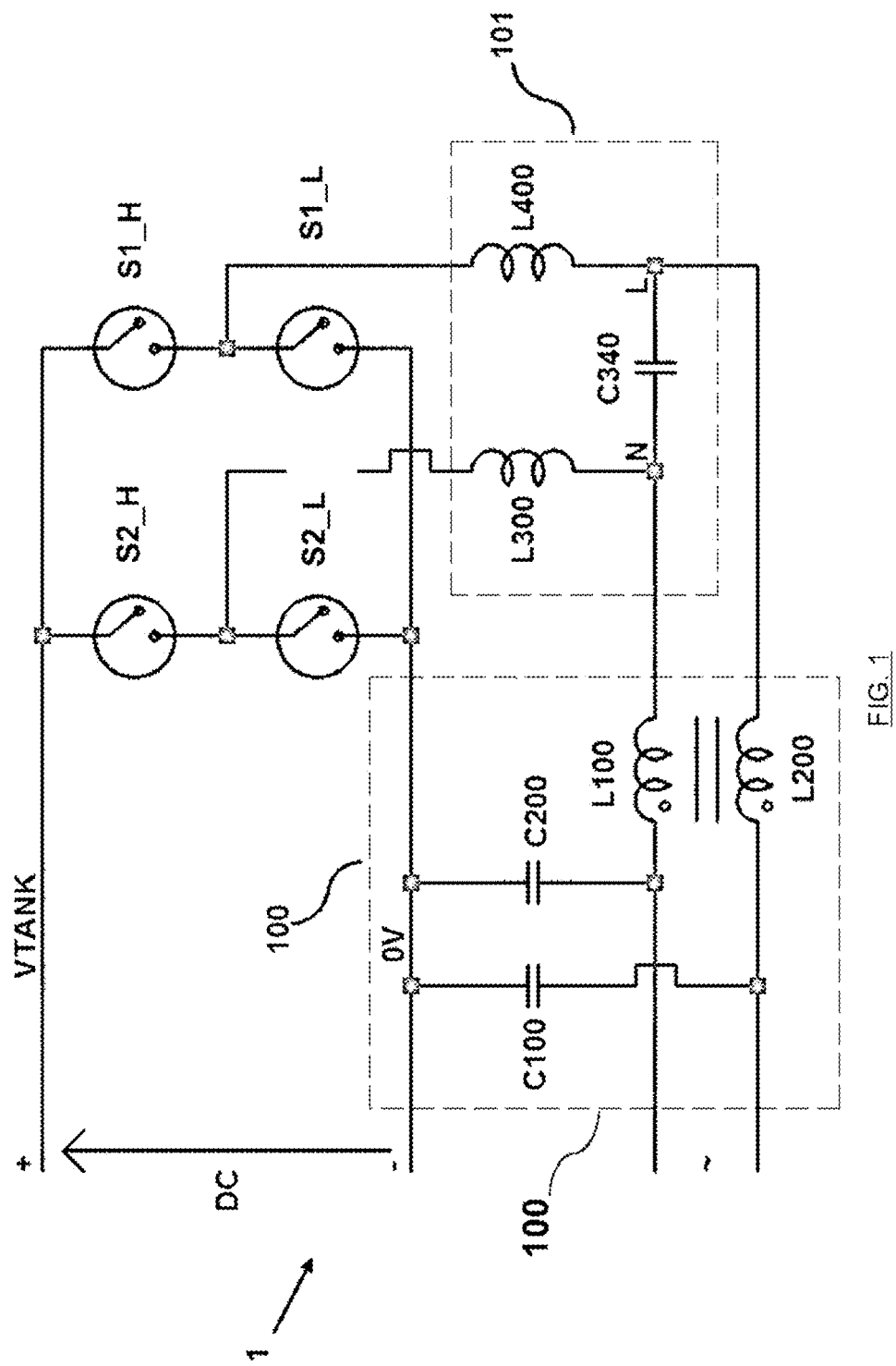
Figure 2:
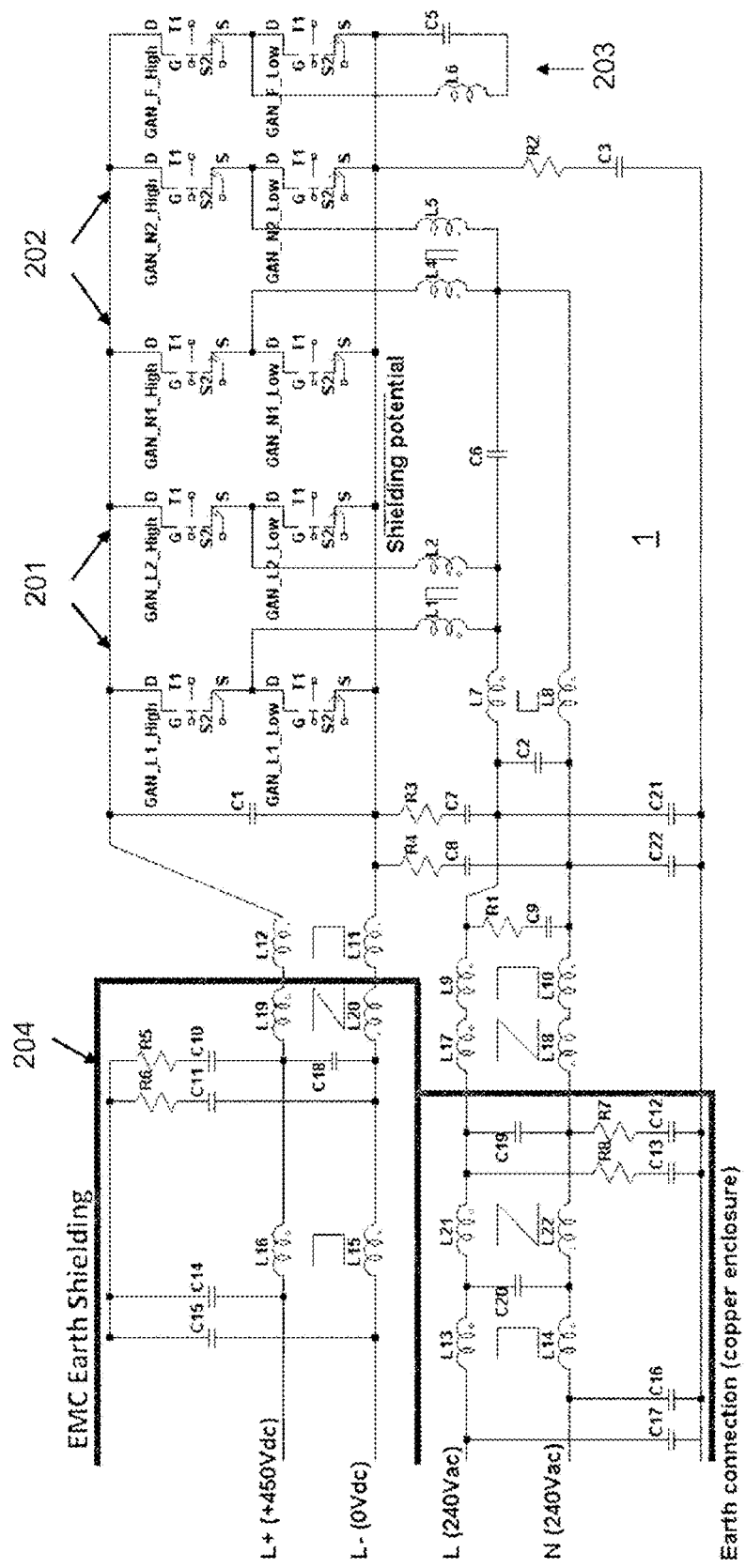

In order to combine a continuous current at the 450 V input stage with an alternating 240 V output voltage, an inverter 1 with at least a three legs topology (full-bridge or 2-legs topology with a supplemental active filter) is chosen. Preferably, a five legs topology is chosen according to a preferred embodiment shown in FIG. 2, because it minimizes energy transfer within the inverter. Accordingly the first half-bridge and the second half-bridge are each preferably split by an additional half-bridge mounted thereon in parallel. It allows accommodating high current and slight switching time differences. Two half bridges 201 (HB) generate the line voltage, while two further half bridges 202 generate the neutral voltage and the last half bridge 203 is used as the above-mentioned active filter.

According to this preferred embodiment (see further FIG. 2), inductors L1 to L6 are rated between 10 μH and 50 μH. Due to the active filter 203 (with C5/L6), input capacitor C1 is reduced to less than 15 μF and C5 is rated at less than 150 μF. Common mode inductors (L7 to L16, see inversed "C" symbol) are rated between 200 μH and 1 mH. The total rating of corresponding Y capacitors (C7, C8, C10-C17, C21, C22) is more than 500 nF while keeping the leakage current below the allowed value (initially 5 mA) because the output sine wave is symmetric between L+ and L−, i.e. $(V_L+V_N)/2 \sim = (V_{L+}+V_{L-})/2 \sim = V_{Earth}$ with split phase grounding configuration and cancels the leakage current, and because some Y capacitors (C7, C8) return to the shield. The EMC differential inductors (L17 to L22, see "Z" symbol) are rated between 10 µH and 20 µH and the X capacitors (C2, C6, C9, C18 to C20) range from 1 µF to 5 µF.

The high density and the high efficiency of this inverter both come from optimized control of the five legs, via switching. For any type of load, this control shall achieve soft switching operation of all GaN devices while minimizing reverse currents during the dead times. A control algorithm ensures that the module is naturally protected against overcurrents. During the debug phase, problems were encountered by the inventors, due to the high processing load demanded by the control algorithm. Finally the processor was upgraded, by use of a 40% faster pin-to-pin compatible model.

The objectives of the control are achieved by applying the following principles:
- digital control based on a fast microcontroller combined with a dedicated logical circuit (CPLD);
- fast measurement of input/output currents and voltages;
- efficient feedback on the switching events of the HBs;
- a learning algorithm for driving the active filter;
- optimization of the switching frequency between 35 and 240 kHz depending on the output current; a variable phase shift between the HBs (0° or 90°) and a dead time modulation of the five HBs (50 ns to 3 µs). The switching losses are then almost canceled and the frequency increase helps to optimize (reduce) the size of the passive components.

Practicing phase shift between the neutral and the line HBs (2 or 4 resp.) is necessary because the DMN filtering inductors are optimized at no phase shift. Soft switching does thus not occur anymore at each GaN switch. Moreover as switching is effected at extremely high speed, and with some uncertainty upon the current flowing in the DMN filtering inductors, next current switch may occur at a current value that has not (yet) returned to zero, thus leading to "not being ZVS". A solution found for letting the current go closer to zero is to increase the dead time of the switch (not shown).

Figure 3:
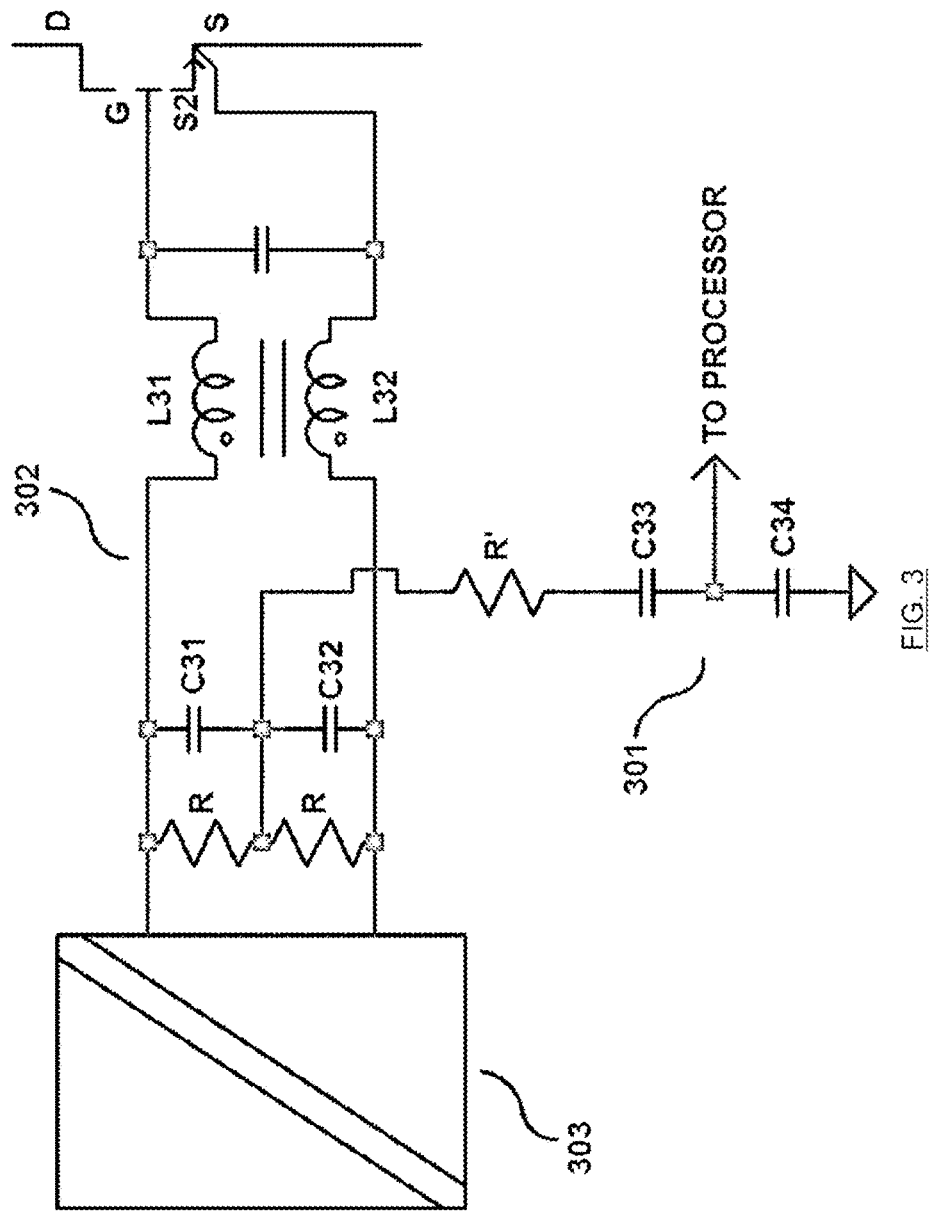

Due to the high speed switching in the converter of the present invention, according to one embodiment, no direct current measurement is carried out but capacitive voltage divider 301 (C33, C34), is used for detecting when the current goes to zero (see FIG. 3). By suitable choice of the capacitors, this capacitive divider allows the processor to manage an acceptable voltage measurement (typically about 5 V instead of maximum peak voltage of 450 V).

In this invention the robustness of the GaN control is critical. Indeed, GaNs switch extremely fast so that they generate high "dV/dt" across the control isolation, far beyond the allowed values for most of the drivers currently on the market. Furthermore, the gate voltage threshold is very low. Still according to the invention, a very compact, low cost and extremely robust driver circuitry has been designed that can drive GaN transistors well within their specifications (see FIG. 3). According to one embodiment shown on FIG. 3, one takes advantage of additional source and gate inductances (L31, L32) to reject CMN traveling in the GaNs directly to ground, without affecting GaN driver 303. CMN filter 302 is provided therefor (L31, C31, L32, C32).

Selecting a right GaN package is also very important. According to an embodiment, a SMD (surface mount) model with a 2-source access, one for the power, one for the command, was selected as the best choice for this design. It allows safe control of the transistor. Moreover, a small package reduces the parasitic inductances and consequently the functional overvoltage. The PCB layout and the positioning of the decoupling capacitors are crucial for operating the GaN properly.

120 Hz Input Current/Voltage Ripple Requirement

To meet the ripple requirement on DC voltage/current input a parallel active filter was designed that can compensate ripple more efficiently than using a large capacitor at the input side. The adopted solution is also more reliable than the use of a "boost"-based topology for which the working voltages could rise up to the limit $V_{max}$ of the GaN transistors.

The active filter works with higher voltage variations ($\sim 200\ V_{pk\text{-}pk}$) and stores the corresponding energy in ceramic capacitors whose capacitance rises as the voltage decreases, leading to three benefits:
- size reduction of the input tank capacitor C1 (less than 15 µF),
- size reduction of the filter capacitor C5 to less than 150 µF,
- inverter robustness due to the use of the GaNs below 450 $V_{dc}$.

The software also contributes thereto; the algorithm maintains $V_{in}$ constant while allowing a larger ripple across the active filter. Moreover, a learning algorithm still reduces the input ripple (by a factor of 3) through correction of the modeling errors due to the presence of dead times.

Miniaturization of Components for DC-AC Conversion

According to an embodiment, use of MLCC capacitors (i.e. ceramic capacitors) for energy storage leads to a more compact and efficient module.

Moreover magnetic components are mainly composed of ferrite whose magnetic losses are known to be very low at high frequencies. The use of Litz wires minimizes the losses due to skin and proximity effects. For further miniaturization, the wires are wound directly onto the ferrite, without a coil former. Their cooling is provided by the air flow of the fan and by use of an aluminum oxide foil placed in the middle of the ferrite to create the requested air gap plus a thermal drain. The size of the filter capacitors and inductors is optimized by increasing allowed ripple current.

As to the output current, an open loop Hall sensor combined with an electromagnetic shield leads to a very compact measurement device, offering galvanic decoupling and reducing the sensitivity to common mode and parasitic inductance noise. Time response thereof is very short which contributes to protect the inverter from short-circuit or high load impacts.

It is wise to note that all other current estimations ($I_{inductor}$, etc.) are made by state observers without current sensors (sensorless measures, e. g. voltages), thereby reducing the overall inverter size.

Thanks to a specific GaN control modulation which reduces the current within the filter inductors L7-L8 (see FIG. 2), their core size is reduced without reaching saturation level.

Obtaining a sandwich structure for all the PCB boards and the heatsink represents a real challenge. As shown on FIG. 5, it was obtained by using micro-spring contacts 507, custom heatsink 512 made by EDM (Electrical Discharge Machining), ultra-thin PCB boards 510, 513, etc. (0.012 inch thick), silicone foam 508 to spread GaN contact pressure on the heatsink 512. All these technical features greatly helped to reduce the size of the inverter.

According to one embodiment, the inverter module comprises mainly two parts. The first one includes device control, auxiliary supply, the five legs (or half bridges) and their corresponding drivers together with the heatsink.

The second part includes the passive filters.

Preferably, a soft switching LLC resonant topology is used for the isolated auxiliary supply 12V/5V/3.3V (~10 W). This reduces the volume thereof to less than 0.128 in.$^3$ (0.8×0.8×0.2 in.), which enables suitable integration within the above-mentioned control part on an unique PCB.

Thermal Management

Based on the estimated and simulated losses, forced-air cooling is the only viable solution able to sufficiently reduce the thermal resistance to ambient air. According to an embodiment, an efficient axial fan (~1.57×1.57×0.6 in.) is placed in the middle of the front plate.

Figure 4:
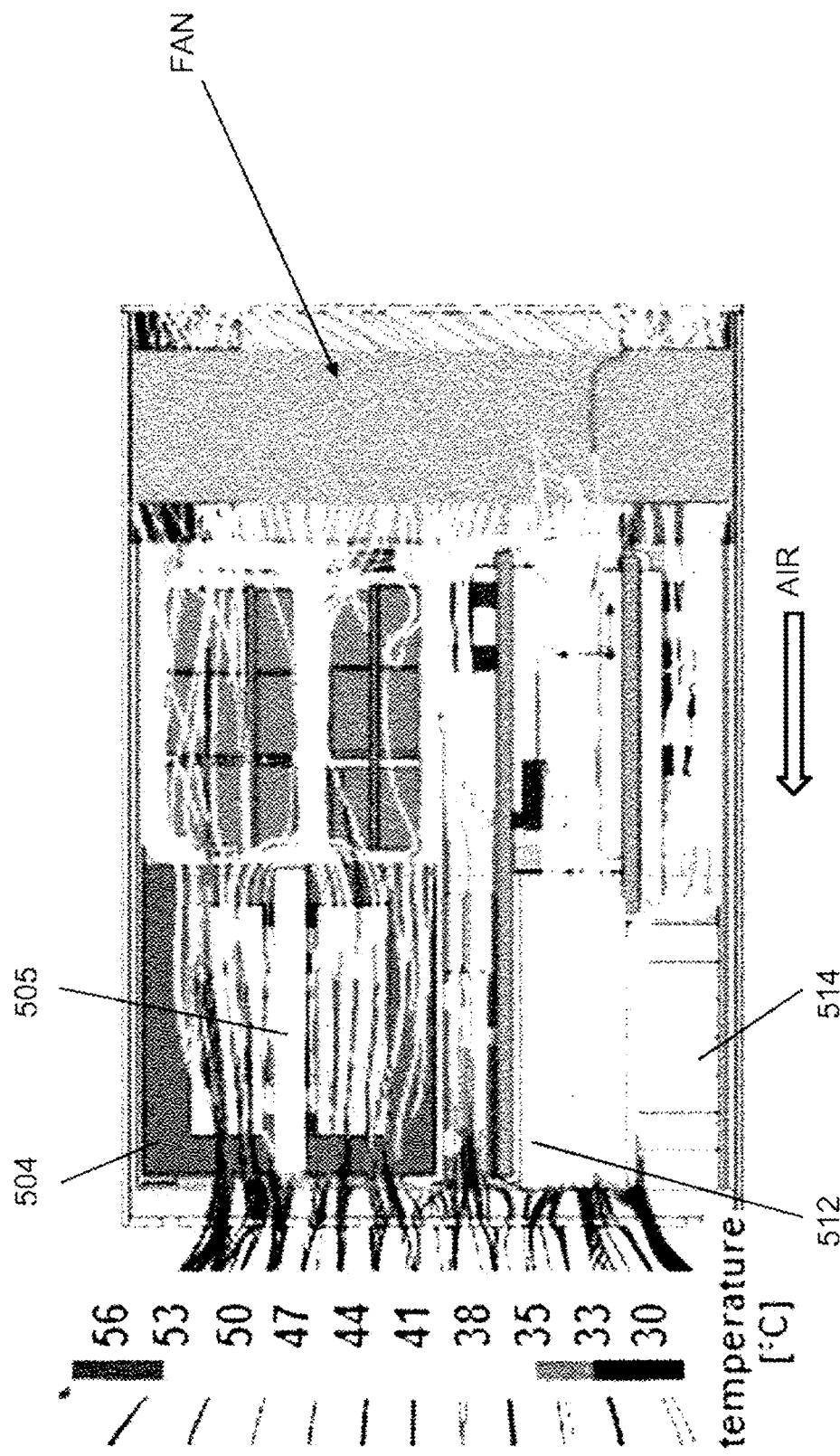
FIG. 4 represents a thermal mapping for an example of inverter components implementation in the present invention, according to a plan view thereof, wherein the hottest parts are located in the direct air flow.

The thermal simulation mapping in FIG. 4 shows the result when all components are optimally positioned around the fan, namely:
- hottest components placed in the direct air flow;
- exchange surface areas maximized;
- pressure losses minimized;
- air speed near the side optimized and
- fresh air entry near the GaN heatsink to minimize the thermal resistance, maximizing the inverter efficiency.

Figure 5:
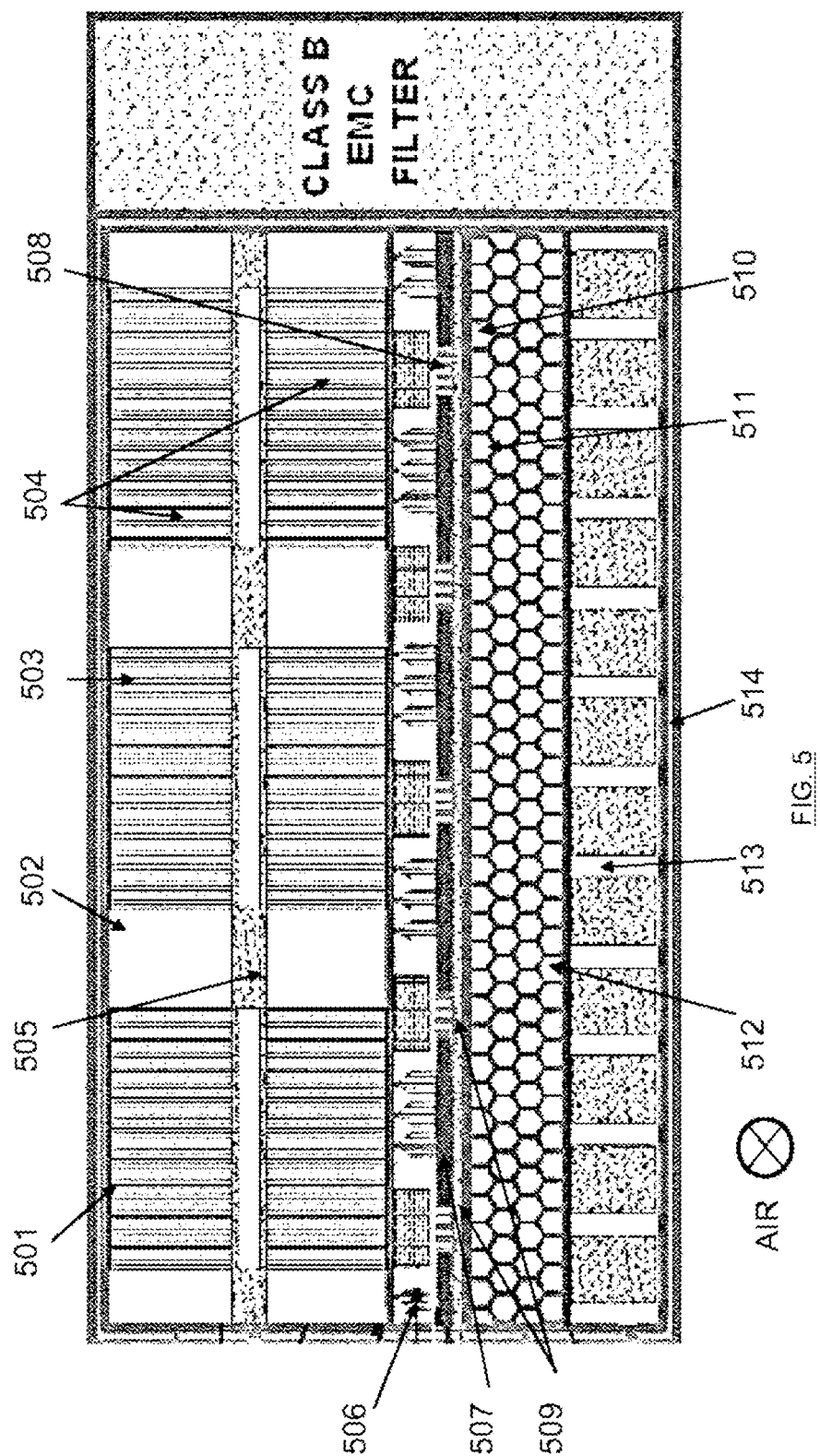
FIG. 5 represents, in a height cross-section view, a detailed structure of the thermal interfaces in an inverter according to an embodiment of the present invention.

Choosing suitable thermal interfaces is then very critical in reducing hot spots on the outer inverter surface. FIG. 5 shows the thermal stack or sandwich according to one embodiment (height cross-section view). The GaN junction temperature does not exceed 60° C. with an ambient temperature of 30° C. at 2 kW load.

FIG. 5 shows a detailed structure of the thermal interfaces according to one embodiment. For one GaN transistor 509 (~2 W loss), the thermal impedances are as follows:
- GaN junction thermal pad: 0.5° C./W;
- PCB design 510 maximizing heat transfer from the GaN transistor 509 to the heatsink 512: 1.1° C./W;
- thermal compound with aluminum oxide dust: 0.3° C./W;
- ceramic insulation foil with aluminum nitride 511: 0.02° C./W;
- thermally conductive glue with silver dust: 0.15° C./W and
- honeycomb-shaped heatsink 512 with forced air (see below): 13° C./W (relative to a single GaN).

The external shield 501, 503 and the heatsink 512 are both made of copper, while the storage capacitors 514 are ceramic MLCC. Both materials were chosen to enhance heat flux and exchange surface area. The capacitor assembly constituting the active filter is an energy storage device but is also an extension of the heatsink 512. The air flow between each MLCC row (preferably with a gap of ±0.04 in. or 1 mm between capacitors) enhances the cooling effect, as the capacitors sides play the role of fins. The volume occupied by the energy storage unit acts as a second heatsink, due to the assembly geometry and the capacitor type (good thermal conductor).

Figure 6:
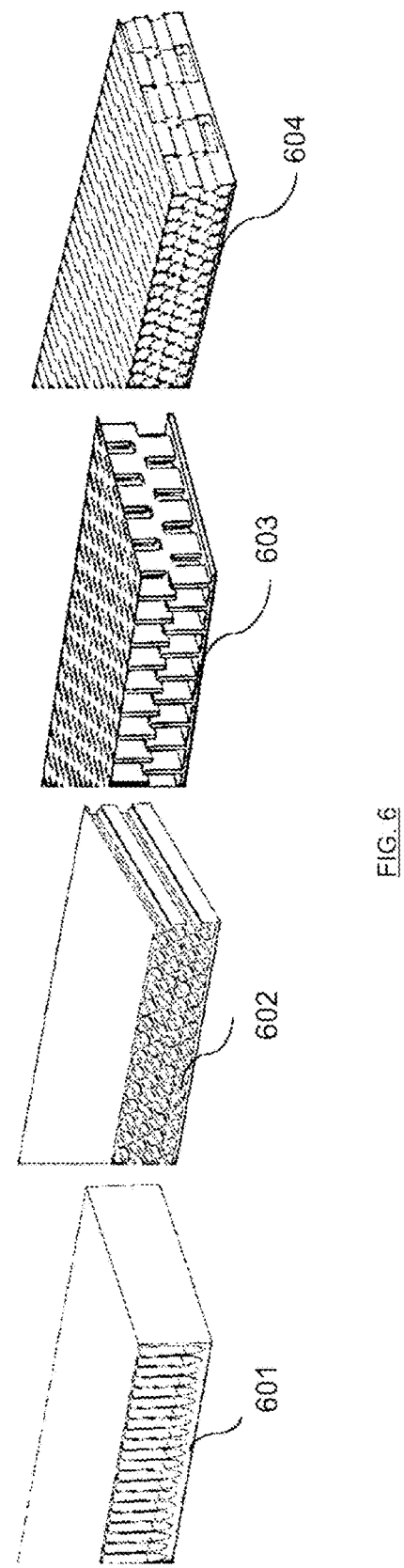
FIG. 6 represents several examples of simulated heatsinks suitable to be used in the present invention.

Several types of heatsinks as shown in FIG. 6 have been thermally simulated and compared with the above-mentioned 3D model (multiple blades 601, honeycomb 602, fins interlaced 603 or not, copper foam 604, etc.).

Preferably a honeycomb heatsink 602 has been selected (Rth_total=1.3° C./W (10 GaN); L2.79×W0.83×H0.26 in.) because it minimizes GaN temperature and has holes large enough to avoid any clogging by dust. The two-dimensional structure surfacically distributes the temperature and further reduces the number of hot spots.

Several inductors 504 (but not all) are preferably thermally fastened to the copper shield 503. In order to meet the external enclosure 60° C. temperature limit requirement, a Gap-Pad 502 provides an electrically insulating but thermally conductive interface between the shield 503 and the external copper enclosure 501. Thereby the thermal resistance of the interface helps to extract heat from the hottest inner components and prevent this heat to be dissipated locally by the external enclosure.

Electromagnetic Compliance (EMC)

In order to be compliant with FCC part 15 class B (for residential equipment, which is more restrictive than FCC Class A, for commercial or industrial equipment), the choice of the topology design and of the modulation type has been based on noise source models. Each filter has been simulated with an established noise model to optimize the inductor design and the PCB routing. Key factors according to the present invention to meet for class B can be summarized as follows:
- soft switching operation of the main switches and auxiliary supply independently of the load;
- variable frequency and specific spread spectrum modulation;
- a first internal shield electrically connected to (L-=O V DC);
- a second shield (external enclosure) and a last filter stage shielding;
- an $AC_{out}$ filter referenced to (L-);
- the use of several small filters instead of a large one;
- the suppression of all the resonant poles at frequencies higher than 50 kHz;
- the use of ceramic capacitors to minimize the parasitic inductances and their size;
- the minimization of coupling between filters;
- the minimization of capacitive coupling in the inductor design.

LIST OF REFERENCE SYMBOLS

100 Common mode noise filter
101 Differential mode noise filter
201 Line switch half bridge
202 Neutral switch half bridge
203 Active filter half bridge
204 Earth shielding or connection
301 Capacitive divider for zero-current crossing detection
302 CMN filter for GaN switch gate
303 GaN driver
501 Copper enclosure
502 Insulation/thermal interface
503 Copper shielding
504 Inductor(s)
505 Ceramic inductor gap
506 PCB interconnection
507 Micro-spring contacts
508 Silicone foam
509 GaN switch
510 PCB with thermal vias
511 Ceramic insulation
512 Honeycomb heatsink
513 PCB for mounting storage capacitors
514 Active filter ceramic capacitor
601 Multiple blades heatsink
602 Honeycomb heatsink
603 Interlaced fins heatsink
604 Copper foam heatsink

TABLE 1

| Parameter | Requirement | Comment |
|---|---|---|
| Maximum load | 2 kVA | At 240 V RMS AC at 60 Hz |
| Power density | >50 W/in$^3$ | |
| Volume | <40 in$^3$(0.66 l) | Rectangular enclosure, max. dim. 20 in., min. 0.5 in. |
| Voltage input | 450 V DC, R = 10 Ω | |
| Voltage output | 240 +/− 12 V AC | Single phase |
| Frequency output | 60 +/− 0.3 Hz | Single phase |
| Power factor of load | 0.7-1 | Leading or lagging |
| THD + N of Vout | <5% | Total harmonic distorsion + noise |
| THD + N of Iout | <5% | Total harmonic distorsion + noise |
| Efficiency | >95% | Measured by weighted average at different loads (var. of CEC method) |
| Input ripple current (120 Hz) | <20% | Measured as $I_{pp}/I_{av}$ from 450 V supply in series with a 10 Ω resistor |
| Input ripple voltage (120 Hz) | <3% | Measured as $V_{pp}/V_{av}$ from 450 V supply in series with a 10 Ω resistor |
| Maximum outer temperature | <60° C. | Tested at 15-30° C. ambient (any outside point to be touched <60° C.) |
| Electromagnetic compliance | FCC Part 15 B | |
| Max. current on chassis GND connex. | <5 mA | |

The invention claimed is:

1. A single phase, non-insulated, miniaturized DC/AC power inverter (1) having an output power density higher than 3000 W/dm$^3$ and comprising:
   a DC input;
   an AC output;
   at least a H full-bridge topology switching circuit (201, 202) having an input connected to the DC input and an output connected to the AC output, and comprising switches made of wide-band semiconductors and preferably of gallium nitride or GaN semiconductors;
   at least one common mode noise Electromagnetic Interference (EMI) filter (100) connected between the DC input and the input of the H full-bridge switching circuit, between the output of the H full-bridge switching circuit and the AC output respectively, said common mode noise filters (100) being referenced to an earth shielding or directly to earth (204), said common noise filters (100) comprising filtering inductors and so-called Y capacitors;
   at least one differential mode noise Electromagnetic Interference (EMI) filter (101) connected, in series with a corresponding common mode noise filter (100), between the DC input and the input of the H full-bridge switching circuit, between the output of the H full-bridge switching circuit and the AC output respectively, said differential mode noise filters (101) comprising so-called X filtering capacitors and optionally inductors;
   a ripple-compensating active filter comprising a switching half-bridge topology (203) provided in parallel with the H full-bridge switching circuit and connected to a LC filter, made of at least one inductor (L6) and at least one storage capacitor (C5);
   wherein said power inverter (1) is packaged in a casing made of an external electrically conductive enclosure (501) containing a fan blowing in an axial direction to a side face of the casing and, in a stacked elevation arrangement, successively from a bottom side to a top side, a layer of active filter capacitors (514), a heatsink (512), a layer of wideband semiconductors switches (509) connected to a Printed Circuit Board (PCB) with thermal vias (510) and a layer of active filtering inductors (504), the fan and the component stacked arrangement being designed so as, in operation, an external temperature of the casing does not overcome 60° C. in any point, for an ambient temperature of maximum 30° C. under a maximum load of 2 kVA.

2. The DC/AC power inverter of claim 1, wherein the layer of active filter capacitors (514) is composed of Printed Circuit Board (PCB) mounted (513) rows of regularly spaced multilayer ceramic capacitors (MLCC), said capacitors being separated by a gap, said gap being preferably of about 1 mm and oriented in the blowing direction of the fan.

3. The DC/AC power inverter of claim 1, wherein the heatsink (512) is a one-piece machined metallic heatsink selected from the group consisting of a multiple blades, honeycomb, interlaced-fins and metal foam heatsink, said heatsink (512) being adjacent to the layer of active filter capacitors (514).

4. The DC/AC power inverter of claim 1, wherein the casing external conductive enclosure (501) surrounds a conductive shielding (503) separated thereof by a thermally conductive interface made of a gap pad (502).

5. The DC/AC power inverter of claim 1, wherein the active filtering inductors (504) are composed of ferrite cores on which Litz wire is directly wound without a coil former, each inductor (504) being made of two coils separated by a ceramic foil (505) placed between the ferrites cores in order to create an air gap as well as thermal drain.

6. The DC/AC power inverter of claim 1, wherein the layer of wideband semiconductors switches (509) connected to a PCB with thermal vias (510) is adjacent the heatsink thanks to a ceramic insulation (511) and microspring contacts (507), silicone foam (508) being provided in gaps in order to uniformly spread switch contact pressure on the heatsink (512).

7. The DC/AC power inverter of claim 4, wherein the casing enclosure (501), the conductive shielding (503) and the heatsink (512) are made of copper.

8. The DC/AC power inverter of claim 1, wherein the common mode and differential mode Electromagnetic Interference (EMI) filters, are separated from the rest in the casing.

9. The DC/AC power inverter of claim 1, wherein part of the active filtering inductors (504) are thermally fastened to a conductive shield (503).

* * * * *